(12) United States Patent
Barthelmess et al.

(10) Patent No.: US 7,319,250 B2
(45) Date of Patent: Jan. 15, 2008

(54) SEMICONDUCTOR COMPONENT AND METHOD FOR PRODUCING THE SAME

(75) Inventors: Reiner Barthelmess, Soest (DE);
Hans-Joachim Schulze, Ottobrunn (DE)

(73) Assignee: EUPEC Europaeische Gesellschaft fur Leistungshalbleiter mbH (DE)

( * ) Notice: Subject to any disclaimer, the term of this patent is extended or adjusted under 35 U.S.C. 154(b) by 47 days.

(21) Appl. No.: 11/246,345

(22) Filed: Oct. 7, 2005

(65) Prior Publication Data

US 2006/0086991 A1    Apr. 27, 2006

Related U.S. Application Data

(63) Continuation of application No. PCT/EP2004/003321, filed on Mar. 29, 2004.

(30) Foreign Application Priority Data

Apr. 9, 2003   (DE)   ................. 103 16 222

(51) Int. Cl.
*H01L 29/74*    (2006.01)
*H01L 31/111*   (2006.01)

(52) U.S. Cl. ........................ 257/131; 257/156

(58) Field of Classification Search ............. 257/46, 257/104, 127, 131, 144, 152, 156, 163, 170, 257/171
See application file for complete search history.

(56) References Cited

U.S. PATENT DOCUMENTS 4,291,329 A * 9/1981 Hanes et al. ............... 257/176

6,351,024 B1    2/2002 Ruff et al. ............... 257/655
2002/0158246 A1 10/2002 Kitamura et al. ............. 257/46

FOREIGN PATENT DOCUMENTS

| DE | 39 10 609 A1 | 10/1990 |
|---|---|---|
| DE | 198 51 461 A1 | 5/2000 |
| EP | 0 768 714 A1 | 4/1997 |
| EP | 0 837 506 A2 | 4/1998 |
| EP | 1 298 717 A1 | 4/2003 |
| JP | 58169972 A | 10/1983 |
| JP | 01162368 A2 | 6/1989 |

OTHER PUBLICATIONS

German Office Action; DE 103 16 222.4-33; 3 pp., Dec. 16, 2003.
International Search Report; PCT/EP2004/003321; 4 pp., Jul. 12, 2004.
International Research Report; PCT/EP2004/003321; 8 pp., Jul. 12, 2004.

* cited by examiner

*Primary Examiner*—Thien F Tran
(74) *Attorney, Agent, or Firm*—Coats & Bennett, P.L.L.C.

(57) ABSTRACT

A method for producing a semiconductor component has the following step: the front side (101) of the semiconductor body (100) is irradiated with high-energy particles using the terminal electrode (40) as a mask, in order to produce recombination centres (80A, 80B) in the semiconductor body (100) for the recombination of the first and second conduction type of charge carriers.

14 Claims, 3 Drawing Sheets

SEMICONDUCTOR COMPONENT AND METHOD FOR PRODUCING THE SAME

CROSS-REFERENCE TO RELATED APPLICATIONS

This application is a continuation of co-pending International Application No. PCT/EP2004/003321 filed Mar. 29, 2004, which designates the United States of America, and claims priority to German application number DE 103 16 222.4 filed Apr. 9, 2003, the contents of which are hereby incorporated by reference in their entirety.

TECHNICAL FIELD

The present invention relates to a method for producing a vertical semiconductor component which has a semiconductor body having an inner region, at least one pn junction in the inner region and an edge region that is arranged between the inner region and an edge. A current flows through components of this type when a suitable voltage is applied in the vertical direction, that is to say perpendicular to a front and a back of the semiconductor body. U.S. Pat. No. 6,351,024 B1, for example, describes a vertical semiconductor component of this type having an inner region, which has a pn junction, and an edge region that adjoins the inner region.

BACKGROUND

When switching off semiconductor components of this type, that is to say when applying a voltage at which the pn junction is reverse-biased, the edge region is particularly important, as explained briefly below. In the case of a forward-biased pn junction, the edge regions are likewise flooded with charge carriers, that is to say electrodes and holes, as a result of diffusion. When switching off the component, these charge carriers need to be removed from the edge regions, which results in the need to dissipate a considerably higher charge in those regions of the inner region which adjoin the edge region than in the other regions of the inner region. The charge carriers, particularly holes, which flow out of the edge regions during the switching-off operation may, in this case, contribute to the production of additional charge carriers (avalanche effect), which leads to increased switching losses as a result of the avalanche effects which begin dynamically and, in the worst case, to destruction of the component. This current density which is higher in the edge region than in the inner region during the switching-off operation limits the currents which can be switched overall using the component.

In order to alleviate this problem, it is known, in principle, from the abovementioned U.S. Pat. No. 6,351,024 B1, to shorten the charge carrier lifetime in the edge region. This is effected, for example, by producing additional recombination centers by irradiating the edge region with high-energy particles. The disadvantage of the known method is that a complicated technique using metallic masks which are difficult to adjust is required. In addition, it is also advantageously intended to shorten the charge carrier lifetime in the inner region of the component, which requires a second complicated mask and irradiation technique.

SUMMARY

Therefore, it is an object of the present invention to provide a simple and cost-effective method for producing a vertical semiconductor component having improved switch-off properties and to provide a vertical semiconductor component having improved switch-off properties.

This object can be achieved by a method for producing a semiconductor component, said method comprising the following method steps of providing a semiconductor body which has a front side, a back side, an inner region, an edge, an edge region which is arranged between the inner region and the edge, a first semiconductor zone of a first conduction type in the inner region and edge region and at least one second semiconductor zone of a second conduction type that is complementary to the first conduction type, said second semiconductor zone being arranged in the inner region in the region of the front, producing a connection electrode in the second semiconductor zone on the front of the semiconductor body, and irradiating the front with high-energy particles using the connection electrode as a mask in order to produce recombination centers in the semiconductor body for the purpose of recombining charge carriers of the first and second conduction types.

The operation of introducing the high-energy particles can be followed by a temperature process for stabilizing the recombination centers in the semiconductor body. The temperature process can be carried out at a temperature of between 220° C. and 360° C. for a period of between 30 minutes and 4 hours. The high-energy particles can be protons or helium atoms. The energy of the high-energy particles and the thickness of the connection electrode that can be used as a mask are matched to one another in such a manner that recombination centers are produced, at least approximately, exclusively in the second semiconductor zone beneath the connection electrode. The edge region of the semiconductor body may have at least one third semiconductor zone of the second conduction type in the region of the front, the energy of the high-energy particles being selected in such a manner that the recombination centers in the edge region are produced, at least approximately, exclusively in the first semiconductor zone. The semiconductor body may have a third semiconductor zone whose doping concentration, starting from the inner zone, decreases in the direction of the edge. The third semiconductor zone may adjoin the second semiconductor zone. The semiconductor body may have at least two third semiconductor zones which are arranged at a distance from one another in the direction of the edge and at a distance from the second semiconductor zone. A fourth zone of the first conduction type can be produced in the region of the back of the semiconductor body, said fourth zone being more highly doped than the first zone.

The object can also be achieved by a semiconductor component comprising a semiconductor body which has a front, a back, an inner region, an edge region which is arranged between the inner region and an edge, a first semiconductor zone of a first conduction type in the inner region and edge region and at least one second semiconductor zone of a second conduction type that is complementary to the first conduction type, said second semiconductor zone being arranged in the inner region in the region of the front, a connection electrode which is applied to the front of the semiconductor body in the second semiconductor zone, and a recombination zone which has recombination centers and is arranged beneath the connection electrode in the second semiconductor zone and in the edge region in the first semiconductor zone.

At least one third semiconductor zone of the second conduction type can be provided in the edge region in the region of the front. There can be a third semiconductor zone whose doping concentration, starting from the inner zone, decreases in the direction of the edge. The third semiconductor zone may adjoin the second semiconductor zone. There can be at least two fourth semiconductor zones which are arranged at a distance from one another in the direction of the edge and at a distance from the second semiconductor zone. There can be a fourth zone of the first conduction type in the region of the back of the semiconductor body, said fourth zone being more highly doped than the first zone.

The inventive method for producing a semiconductor component involves providing a semiconductor body which has a front, a back, an inner region, an edge, an edge region which is arranged between the inner region and the edge, a first semiconductor zone of a first conduction type in the inner region and edge region and at least one second semiconductor zone of a second conduction type that is complementary to the first conduction type, said second semiconductor zone being arranged in the inner region in the region of the front. The production of such a semiconductor body having a pn junction in the inner region and having an edge region is sufficiently well known, with the result that it will not be discussed in any more detail.

A connection electrode which can be used to make electrical contact with the second semiconductor zone of the subsequent component is then produced in the second semiconductor zone on the front of the semiconductor body. The front of the semiconductor body is then irradiated with high-energy particles, for example protons or helium atoms, with the connection electrode being used as a mask for the irradiation process and ensuring that, in that region of the inner zone which is covered by the connection electrode, the particles do not penetrate as deeply into the semiconductor body as in that region of the edge zone which is not covered by the connection electrode.

The particles which are introduced into the semiconductor body produce recombination centers, with irradiation preferably being followed by a temperature step which is used to stabilize the recombination centers. The recombination centers used are double blanks or A centers (blanks/oxygen complexes) which are produced by irradiation and the temperature step which optionally follows. The heat treatment is carried out, for example, at temperatures of between 220° C. and 360° C. for a period of between 30 minutes and 4 hours, depending on the temperature.

The defects which are caused by irradiation and are used as recombination centers have higher recombination effectiveness in an n-doped region than in a p-doped region and thus shorten the charge carrier lifetime to a greater extent in an n-doped region. The irradiation energy of the high-energy particles and the thickness of the connection electrode that is used as a mask are matched to one another in such a manner that recombination centers are produced, at least approximately, exclusively in the second semiconductor zone beneath the connection electrode.

This makes it possible, when the first semiconductor zone is n-doped and the second semiconductor zone is p-doped, to shorten the charge carrier lifetime to a lesser degree in the second semiconductor zone in the inner region (which is desirable in order to set the static and dynamic properties), while the charge carrier lifetime is considerably shortened, as desired, in the first semiconductor zone in the edge region in order to diminish the avalanche effects (explained) during the switching-off operation.

In order to increase the dielectric strength in the edge region, the edge region of the semiconductor body has at least one third semiconductor zone of the second conduction type in the region of the front. In this case, one exemplary embodiment has at least two third semiconductor zones which are at a distance from one another in the direction of the edge and are at a distance from the second semiconductor zone. The mode of action of such third semiconductor zones which preferably surround the inner region in an annular manner and are therefore referred to as field rings is described, for example, in Baliga: "Power Semiconductor Devices", PWS Publishing, 1995, pages 98-100.

In another exemplary embodiment, a third semiconductor zone adjoins the second semiconductor zone, the doping of this third semiconductor zone decreasing in the direction of the edge. A semiconductor zone of this type is also referred to as a VLD (Variation of Lateral Doping) zone.

The irradiation energy of the high-energy particles is selected in such a manner that the particles in the edge region penetrate so deeply into the semiconductor body that the recombination zones are essentially produced beneath the third semiconductor zone which is used to increase the dielectric strength in the edge region, that is to say in the first semiconductor zone. The semiconductor body is advantageously beveled at the edge, this constituting a further known measure for increasing the dielectric strength in the edge region but not being required for the effectiveness of the method.

Using the connection electrode as a mask, the inventive method makes it possible, in a simple manner, to produce a recombination zone having lower recombination effectiveness in the second semiconductor zone in the inner region and a recombination zone having higher recombination effectiveness in the first semiconductor zone in the edge region.

The inventive semiconductor component comprises a semiconductor body which a front, a back, an inner region, an edge, an edge region which is arranged between the inner region and the edge, a first semiconductor zone of a first conduction type in the inner region and edge region and at least one second semiconductor zone of a second conduction type that is complementary to the first conduction type, said second semiconductor zone being arranged in the inner region in the region of the front. A connection electrode is applied to the front of the semiconductor body in the second semiconductor zone. In addition, there is a recombination zone which has recombination centers and is arranged beneath the connection electrode in the second semiconductor zone and in the edge region in the first semiconductor zone.

In order to increase the dielectric strength in the edge region, field rings of the second conduction type or a VLD zone is/are preferably provided in the edge region beneath the front.

BRIEF DESCRIPTION OF THE DRAWINGS

The present invention will be explained in more detail below in exemplary embodiments and with reference to figures, in which.

Unless stated otherwise, identical reference symbols denote identical parts with the same meaning in the figures.

DETAILED DESCRIPTION

Figure 1:
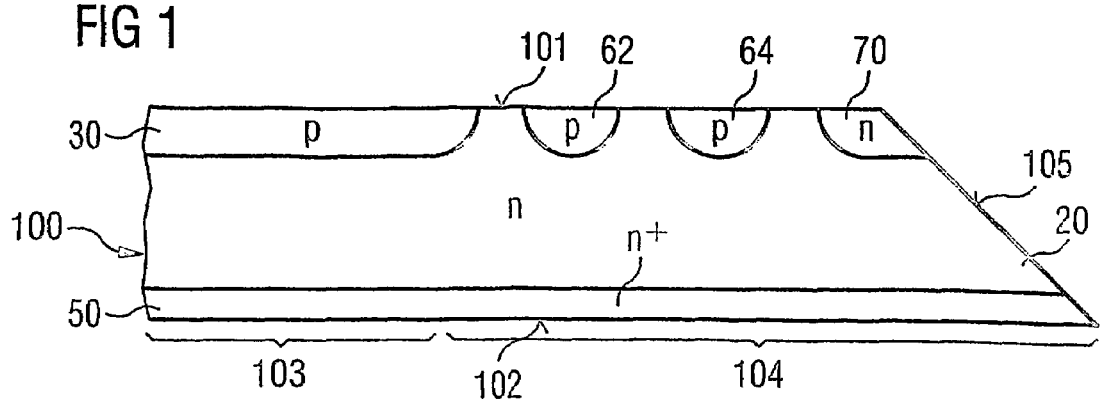
FIG. 1 shows a partial cross section through a semiconductor body on which the inventive method is based.

The inventive method for producing a semiconductor component is explained below with reference to FIGS. 1 to 3 for producing a vertical power diode. The method involves providing a semiconductor body 100 which is partially shown in cross section in FIG. 1. The semiconductor body 100 has a front 101, a back 102 and an edge 105 which runs in a beveled manner in the exemplary embodiment. The semiconductor body comprises an inner region 103 at a distance from the edge 105 and an edge region 104 arranged between the inner region 103 and the edge. The semiconductor body 100 shown has n-type basic doping, the semiconductor regions having this basic doping being referred to below as the first semiconductor zone 20. A p-doped second semiconductor zone 30 is introduced into said first semiconductor zone 20 in the inner region 103 beneath the front 101, with the result that a pn junction is formed between said second semiconductor zone 30 and the first semiconductor zone 20 in the inner region 103. Provided in the edge region 104 beneath the front 101 are p-doped field rings 62, 64 which, starting from the second semiconductor zone 30, are arranged at a distance from one another in the direction of the edge 105 and at a distance from the second semiconductor zone 30. In the region of the front 101, an n-doped semiconductor zone 70, which is used as a channel stopper, directly adjoins the edge 105.

The semiconductor body 100 also comprises a highly n-doped fifth semiconductor zone 50 which adjoins the first semiconductor zone 20 in the region of the back 102. This highly n-doped semiconductor zone 50 which is used as an n-type emitter forms the cathode zone of the subsequent semiconductor component in the form of a diode. In the inner region 103, the first semiconductor zone 20 forms the n-type base and the p-doped second semiconductor zone 30, which is used as a p-type emitter, forms the anode zone. The field rings 62, 64 in the edge region 104 are used, in a known manner, to increase the dielectric strength of the component in the edge region. The bevel (which is likewise known) of the edge 105 serves the same purpose.

The provision of a semiconductor body (shown in FIG. 1) having the semiconductor zones which have been explained: is sufficiently well known, with the result that it is possible to omit a further explanation of this.

Figure 2:
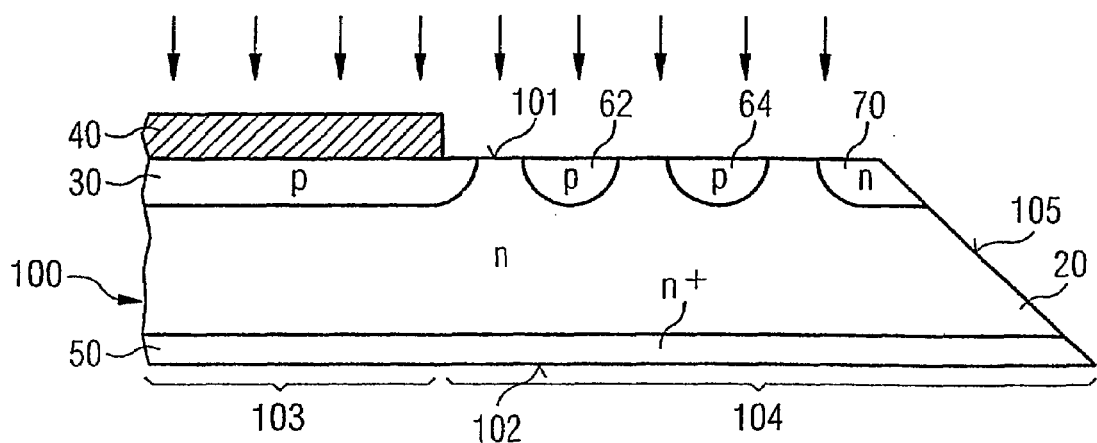
FIG. 2 shows the semiconductor body as shown in FIG. 1 during the next method steps for producing a semiconductor component.

As shown in FIG. 2, a connection electrode 40 is applied to the front 101 of the semiconductor body 100 in the region of the second semiconductor zone 30 (p-type emitter), said connection electrode being used to make subsequent electrical contact with the p-type emitter 30. The front 101 of the semiconductor body is then irradiated with high-energy particles, for example protons or helium atoms, which penetrate into the semiconductor body 100. In this case, the penetration depth beneath the connection electrode 40 is shallower than in the other regions, since the connection electrode 40 brakes the high-energy particles even before they penetrate into the semiconductor body 100. Irradiating the semiconductor body 100 with high-energy particles serves to produce recombination centers in the semiconductor body with the aim of shortening the charge carrier lifetime. These recombination centers, for example double blanks or A centers, are formed by defects in the crystal lattice, which defects are caused by the high-energy particles. During irradiation, for example with protons or helium atoms, use is made, in this case, of the effect that the highest concentration of defects is produced in a relatively narrow zone, the "end of range" region, in which the irradiation particles emit most of their energy and are thus braked.

This irradiation with high-energy particles is preferably followed by a heat treatment method in which the semiconductor body is heated to temperatures of between 220° C. and 360° C. for a period of between 30 minutes and 4 hours in order to stabilize the recombination centers.

The penetration depth of the high-energy particles depends on the irradiation energy and, in the region of the connection electrode 40, on the thickness of this connection electrode 40. In this case, the irradiation energy and the thickness of this connection electrode 40 are matched to one another in such a manner that the recombination centers are produced beneath the connection electrode 40 in the p-doped second semiconductor zone 30. The recombination centers have lower recombination effectiveness in the p-doped zone 30 than in the n-doped first semiconductor zone 20 in the edge region, with the result that the recombination centers in this p-doped region 30 shorten the charge carrier lifetime to a lesser degree than in the n-doped regions 10. In addition to in the first semiconductor zone 20 in the edge region 104, it is also desirable to shorten the charge carrier lifetime to a certain degree in the p-doped anode zone 30 in order to be able to use it to set the static and dynamic properties of the component.

The irradiation energy of the high-energy particles is also selected in such a manner that the recombination centers in the edge region 104 are essentially produced in the first semiconductor zone 20 (n-type base) beneath the field rings 62, 64 and the channel stopper 70.

Figure 3:
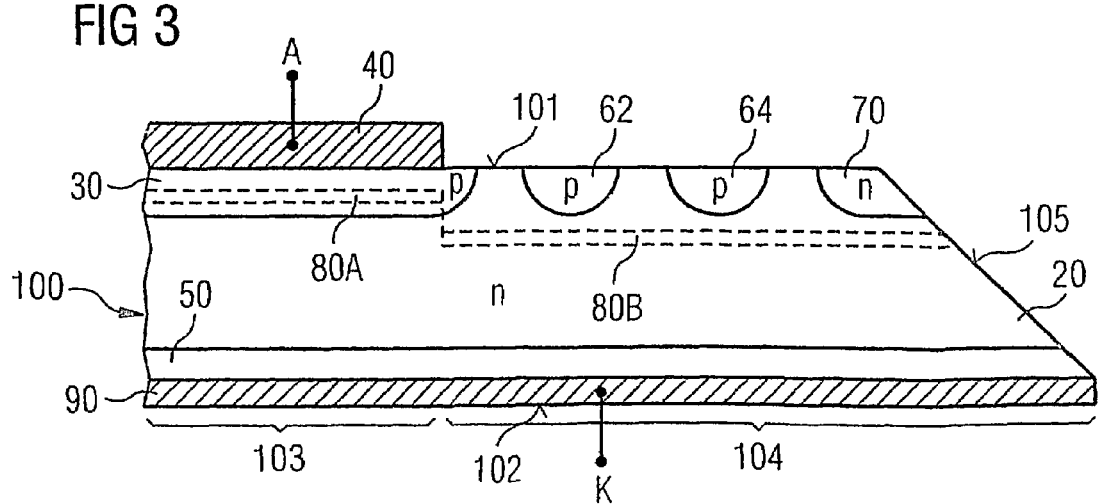
FIG. 3 shows a partial cross section through a semiconductor component which has been produced using the inventive method.

As the result, FIG. 3 schematically shows the physical position of the recombination centers beneath the connection electrode 40 in the inner region 103 and in the edge region 104, the reference symbol 80A denoting the recombination zone in the anode zone 30 and the reference symbol 80B denoting the recombination zone in the edge region 104. In this case, the recombination zone 80A beneath the connection electrode is closer to the front 101, since the high-energy particles are braked in this region by the connection electrode 40 even before they penetrate into the semiconductor body 100. In the edge region 104, which does not contain a connection electrode, the high-energy particles correspondingly penetrate more deeply into the semiconductor body 101, with the result that the recombination zone 80B is further away from the front 101 here. Since the irradiation energy of the individual particles is subject to fluctuations and on account of random scatter effects in the semiconductor lattice, recombination zones 80A, 80B having a particular width in the vertical direction of the semiconductor body are produced, this width being dependent, inter alia, on the irradiation energy. In this case, most of the recombination centers are in the "end of range" region of irradiation.

The inventive method makes it possible, in a simple manner, to produce a vertical semiconductor component having a pn junction, in the edge region 104 of which the charge carrier lifetime is effectively shortened by means of recombination centers, with the charge carrier lifetime likewise additionally being shortened in the inner region 103 in the second semiconductor zone 30 (which, in the case of diodes, is used as a p-type emitter) but to a lesser degree than in the edge region.

The inventive method is not restricted to producing semiconductor diodes but rather can be used for any desired vertical semiconductor components, for example MOS transistors, IGBTs or thyristors, which have a pn junction in the inner region and in which it is desirable to shorten the charge carrier lifetime in the edge region.

In addition to the abovementioned possible way of using the thickness of the connection electrode 40 to set the penetration depth of the high-energy particles in the inner region 103, it is also possible to influence this penetration depth using the choice of electrode material. In this case, the high-energy particles penetrate less deeply into the semiconductor body 100, the "denser" the electrode material. Examples of suitable electrode materials are: gold (Au), copper (Cu), molybdenum (Mb), titanium (Ti) or tungsten (W).

Figure 4:
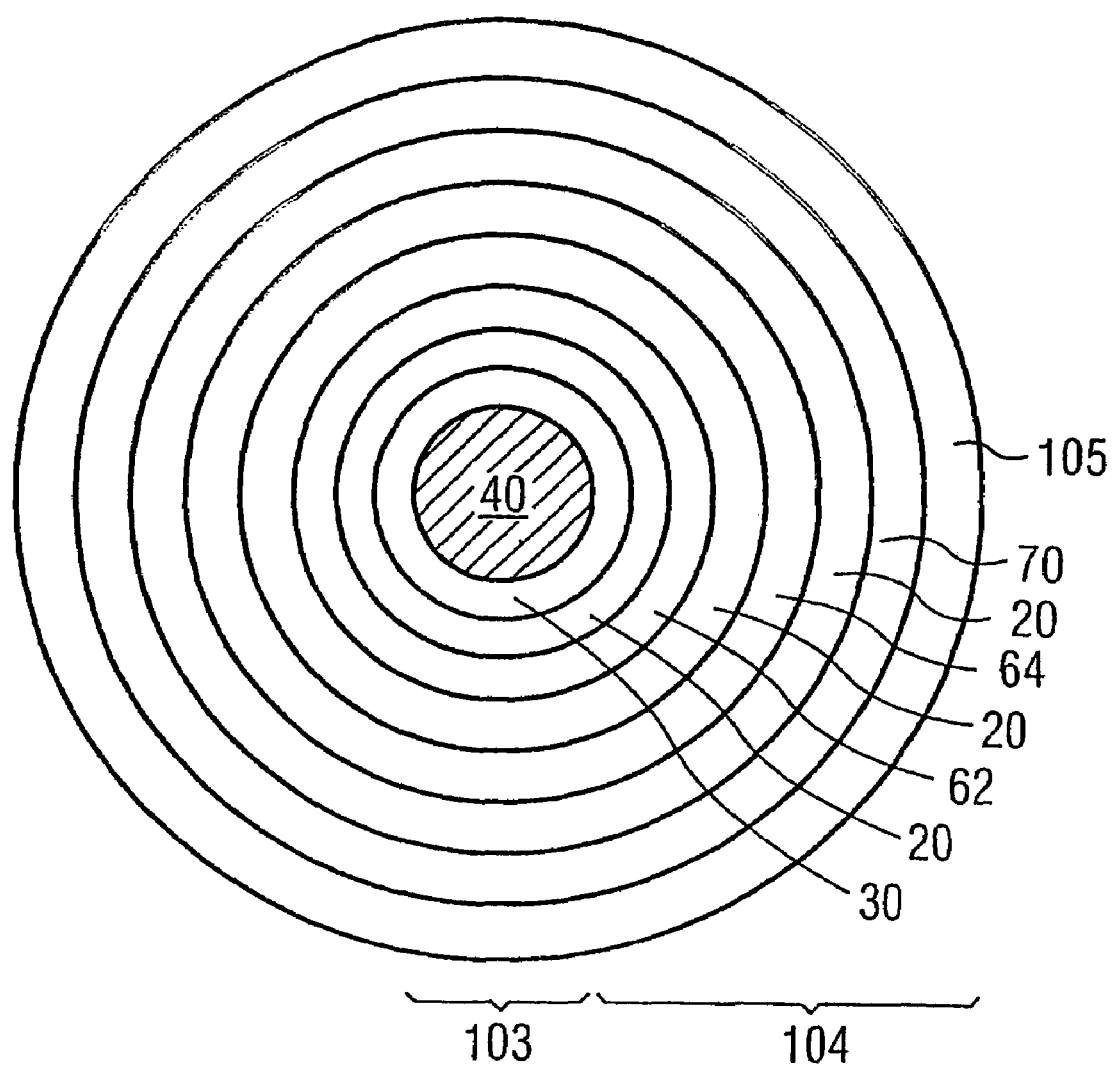
FIG. 4 shows a schematic plan view of the semiconductor component shown in FIG. 3.

FIG. 4 schematically shows a plan view of the front 101 of the semiconductor component which is shown in FIG. 3 and, in the example, is formed in a circular manner with a circumferential edge 105 and edge region 104. It will be pointed out that the illustration in FIG. 4, in which the area of the edge region 104 is considerably larger than that of the inner region 103, is not to scale.

Figure 5:
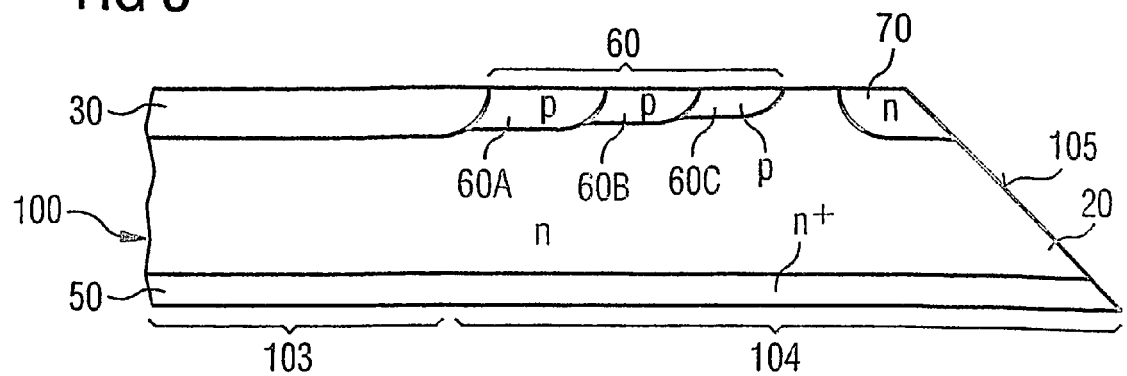
FIG. 5 shows a partial cross section through another semiconductor body which forms the starting point for an exemplary embodiment of the inventive method.
Figure 6:
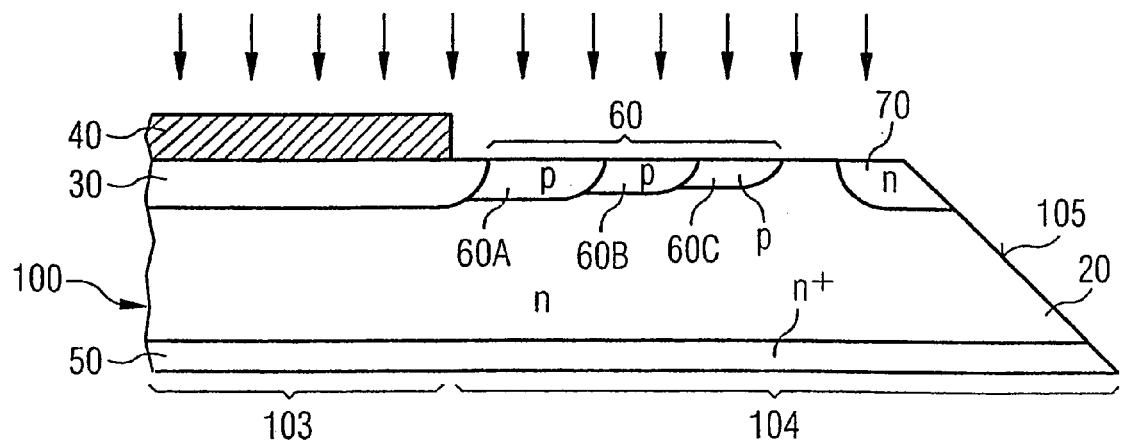
FIG. 6 shows the semiconductor body as shown in FIG. 5 during further method steps for producing the semiconductor component.
Figure 7:
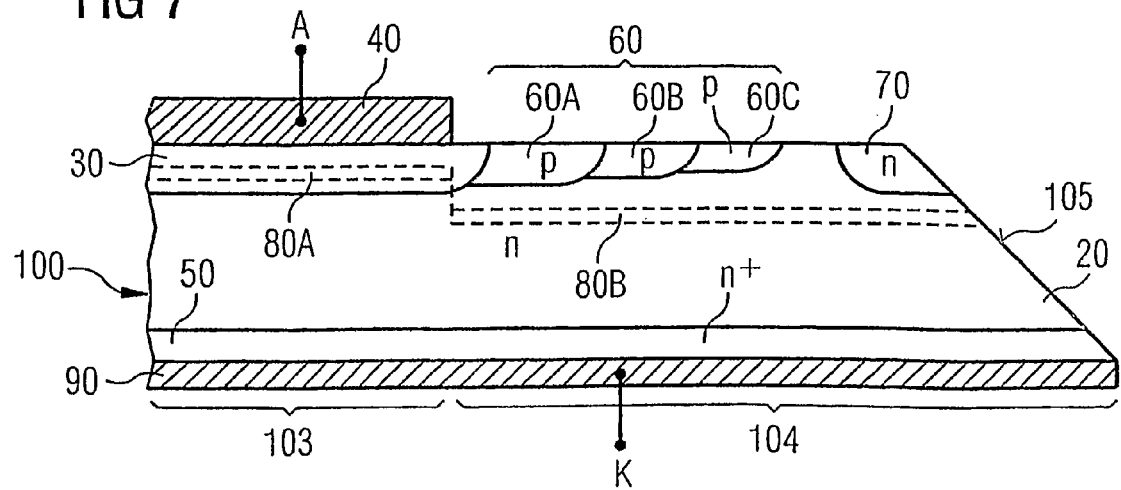
FIG. 7 shows a partial cross section through an inventive semiconductor component.

FIGS. 5 to 7 illustrate a method for producing a further semiconductor component in the form of a diode, the method differing from that shown in FIGS. 1 to 3 by virtue of the fact that, instead of field rings (reference symbols 62, 64 in FIGS. 1 to 3), the semiconductor body used has a VLD zone 60 as a third semiconductor zone, which adjoins the second semiconductor zone 30 in the direction of the edge 105 and the doping of which, starting from the second semiconductor zone 30, decreases in the direction of the edge 105. A VLD zone of this type is achieved, for example, by the zone 60 being constructed from a plurality of semiconductor zones 60A, 60B, 60C which are arranged next to one another in the lateral direction. The doping within these semiconductor zones 60A-60C may be respectively homogeneous in this case, the doping decreasing from semiconductor zone 60A, 60B to semiconductor zone 60B, 60C in the direction of the edge 105.

The other method steps for producing the semiconductor component, namely applying a connection electrode 40, irradiating the front 101 of the semiconductor body with high-energy particles and, optionally, a heat treatment step that follows irradiation, correspond to the method explained with reference to FIGS. 1 to 3. In this case, the energy of the high-energy particles is also selected here in such a manner that the recombination zone 80B in the edge region 104 is essentially produced in the n-type base 20, that is to say beneath the VLD zone 60.

In order to complete the components, a further connection electrode 90 may be applied to the back 102, said further connection electrode making it possible to make electrical contact with the highly n-doped semiconductor zone and being used as a cathode electrode in the case of diodes.

LIST OF REFERENCE SYMBOLS

20 First semiconductor zone, n-type base
30 Second semiconductor zone, p-type emitter
50 Fourth semiconductor zone, n-type emitter
60, 60A, 60B, 60C VLD zone
62, 64 Third semiconductor zone, field rings
70 Channel stopper
80A, 80B Recombination zone
100 Semiconductor body
101 Front
102 Back
103 Inner region
104 Edge region
105 Edge

What is claimed is:

1. A semiconductor component comprising:
   a semiconductor body which has a front, a back, an inner region, an edge region which is arranged between the inner region and an edge, a first semiconductor zone of a first conduction type in the inner region and edge region and at least one second semiconductor zone of a second conduction type that is complementary to the first conduction type, said second semiconductor zone being arranged in the inner region in the region of the front,
   a connection electrode which is applied to the front of the semiconductor body in the second semiconductor zone, and
   a recombination zone which has recombination centers and is arranged beneath the connection electrode in the second semiconductor zone closer to the front and in the edge region in the first semiconductor zone further away from the front such that the recombination zone extends deeper into the semiconductor body from the front in the first semiconductor zone than in the second semiconductor zone.

2. A semiconductor component according to claim 1, wherein there is a fourth zone of the first conduction type in the region of the back of the semiconductor body, said fourth zone being more highly doped than the first semiconductor zone.

3. A semiconductor component according to claim 1, wherein the recombination zone extends along a substantial length of the second semiconductor zone and along a partial length of the first semiconductor zone.

4. A semiconductor component according to claim 1, wherein the recombination centers arranged in the first semiconductor zone have a higher recombination effectiveness than the recombination centers arranged in the second semiconductor zone.

5. A semiconductor component according to claim 1, wherein at least one third semiconductor zone of the second conduction type is provided in the edge region in the region of the front.

6. A semiconductor component according to claim 5, wherein there are at least two fourth semiconductor zones which are arranged at a distance from one another in the direction of the edge and at a distance from the second semiconductor zone.

7. A semiconductor component according to claim 5, wherein there is a third semiconductor zone whose doping concentration, starting from the inner zone, decreases in the direction of the edge.

8. A semiconductor component according to claim 7, wherein the third semiconductor zone adjoins the second semiconductor zone.

9. A semiconductor component comprising:
   semiconductor body which has a front, a back, an inner region, an edge region which is arranged between the inner region and an edge, a first semiconductor zone of a first conduction type in the inner region and edge region and at least one second semiconductor zone of a second conduction type that is complementary to the first conduction type, said second semiconductor zone being arranged in the inner region in the region of the front, a connection electrode which is applied to the front of the semiconductor body in the second semiconductor zone, a recombination zone which has recombination centers and is arranged beneath the connection electrode in the second semiconductor zone closer to the front and in the edge region in the first semiconductor zone further away from the front such that the recombination zone extends deeper into the semiconductor body from the front in the first semiconductor zone than in the second semiconductor zone, and at least one third semiconductor zone of the second conduction type in the edge region in the region of the front.

10. A semiconductor component according to claim 9, wherein there are at least two fourth semiconductor zones which are arranged at a distance from one another in the direction of the edge and at a distance from the second semiconductor zone.

11. A semiconductor component according to claim 9, wherein the recombination zone extends along a substantial length of the second semiconductor zone and along a partial length of the first semiconductor zone.

12. A semiconductor component according to claim 9, wherein the recombination centers arranged in the first semiconductor zone have a higher recombination effectiveness than the recombination centers arranged in the second semiconductor zone.

13. A semiconductor component according to claim 9, wherein there is a third semiconductor zone whose doping concentration, starting from the inner zone, decreases in the direction of the edge.

14. A semiconductor component according to claim 13, wherein the third semiconductor zone adjoins the second semiconductor zone.

* * * * *

UNITED STATES PATENT AND TRADEMARK OFFICE
CERTIFICATE OF CORRECTION

| | | |
|---|---|---|
| PATENT NO. | : 7,319,250 B2 | Page 1 of 1 |
| APPLICATION NO. | : 11/246345 | |
| DATED | : January 15, 2008 | |
| INVENTOR(S) | : Reiner Barthelmess and Hans-Joachim Schulze | |

It is certified that error appears in the above-identified patent and that said Letters Patent is hereby corrected as shown below:

On the Title page, please make the following correction:
        (73) Assignee: EUPEC <u>Europaische</u> ~~Europaeische~~ Gesellschaft fur Leistungshalbleiter mgH (DE)

On the Title page, please make the following correction:
        (30)   Foreign Application Priority Data
        Apr. 9, 2003   (DE) ........................................103 16 222<u>.4</u>

In the specification, column 4, line 33, please make the following change:
        semiconductor body which <u>has</u> a front, a back, an inner region, Signed and Sealed this Twenty-ninth Day of July, 2008

JON W. DUDAS
*Director of the United States Patent and Trademark Office*